United States Patent
Chang

(10) Patent No.: US 7,570,512 B2
(45) Date of Patent: Aug. 4, 2009

(54) PHASE CHANGE MEMORY DEVICE WITH REDUCED UNIT CELL SIZE AND IMPROVED TRANSISTOR CURRENT FLOW AND METHOD FOR MANUFACTURING THE SAME

(75) Inventor: Heon Yong Chang, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 196 days.

(21) Appl. No.: 11/778,141

(22) Filed: Jul. 16, 2007

(65) Prior Publication Data

US 2008/0101112 A1    May 1, 2008

(30) Foreign Application Priority Data

Oct. 31, 2006    (KR) ............... 10-2006-0106900

(51) Int. Cl.
   *G11C 11/00*    (2006.01)
(52) U.S. Cl. ............... 365/163; 365/148; 257/2; 438/95
(58) Field of Classification Search ............... 365/148, 365/163; 257/2–5; 438/95–96
   See application file for complete search history.

(56) References Cited

U.S. PATENT DOCUMENTS 5,296,716 A * 3/1994 Ovshinsky et al. ............ 257/3
6,795,338 B2 * 9/2004 Parkinson et al. ........... 365/163

FOREIGN PATENT DOCUMENTS

KR    1020040104834 A    12/2004

* cited by examiner

*Primary Examiner*—Richard Elms
*Assistant Examiner*—Harry W Byrne
(74) *Attorney, Agent, or Firm*—Ladas & Parry LLP

(57) ABSTRACT

A phase change memory device includes: a semiconductor substrate having active areas; a pair of word lines formed over the active areas and connected with each other at each end thereof; source areas formed in the respective active areas at both sides of the pair of word lines; drain areas formed in the respective active areas between the word lines of the pair of word lines connected with each other at each end thereof; ground lines and cell selection lines formed so as to make contact with the respective source areas respectively; lower electrodes formed so as to make contact with the drain areas; phase change layers and upper electrodes stacked over the respective lower electrodes; and bit lines formed over upper portion of the active areas so as to make contact to the upper electrodes.

15 Claims, 6 Drawing Sheets

PHASE CHANGE MEMORY DEVICE WITH REDUCED UNIT CELL SIZE AND IMPROVED TRANSISTOR CURRENT FLOW AND METHOD FOR MANUFACTURING THE SAME

CROSS-REFERENCES TO RELATED APPLICATIONS

The present application claims priority to Korean patent application number 10-2006-0106900, filed on Oct. 31, 2006, which is incorporated by reference in its entirety.

BACKGROUND OF THE INVENTION

The present invention relates to a phase change memory device and a method for manufacturing the same, and more particularly to a phase change memory device capable of reducing the size of a unit cell as well as raising the current flow in a transistor, and a method for manufacturing the same.

Memory devices may be categorized into a Random Access Memory (RAM) or a Read Only Memory (ROM). RAM devices are volatile memory devices (such as Dynamic RAM or DRAM, and Static RAM or SRAM), which will lose input information when power is off. The ROM devices are non-volatile memory devices (such as flash memory and Electrically Erasable Programmable ROM or EEPROM), which preserves the stored state of input information even when power is off.

Although DRAMS are generally considered very good memory devices in many ways, there are known difficulties for high integration as each DRAM requires a high charge storage capacity leading to increased electrode surface area. High integration is also considered to be difficult for flash memories as each flash memory having a stacked structure of two gates requires an operational voltage higher than its power source voltage and thus requires a separate booster circuit in order to establish the voltage necessary for write and erase operations.

Thus, studies were made to develop a new type of highly integratable non-volatile memory device having a simple and not unduly complicated structure. A phase change memory (in particular, a phase change RAM) is one such non-volatile memory device being researched.

A phase change memory device is a memory device in which the current flow between upper and lower electrodes causes the phase change layer interposed between the electrodes to undergo a phase change between a crystalline phase and an amorphous phase. The resistance difference of the phase change of the phase change layer is then used to discern the types of information stored in the memory cell.

More specifically, the phase change memory device uses a Chalcogenide layer, a compound layer of Germanium (Ge), Stibium (Sb), and Tellurium (Te), as the phase change layer. Joule heat generated through the application of a current causes the Chalcogenide layer to undergo a phase change between a crystalline phase and an amorphous phase. Here, because the phase change layer has a higher resistance when in the amorphous phase as compared to the crystalline phase, the phase change memory uses a read mode to distinguish whether the information stored in the phase change memory cell corresponds to logic "1" or logic "0" by detecting the current flowing through the phase change layer.

FIG. 1A is a graph illustrating a phase change of a phase change layer in a conventional phase change memory device. As illustrated in the drawing, the phase change layer is changed to the amorphous phase by heating it at a temperature higher than the melting temperature (Tm) for a short time (first operation period: $T_1$) and then cooling it at a rapid speed (see curve 'A'). To the contrary, the phase change layer is changed to the crystalline phase by heating it at a temperature lower than the melting temperature (Tm) and higher than crystallization temperature (Tc) for a time (second operation period: $T_2$) longer than the first operation period ($T_1$) and then cooling it (see curve 'B').

Thus, in writing current necessary for the phase change of the phase change layer, it can be appreciated that a high current and a short pulse are required for the amorphous phase, and a low current and a long pulse are required for the crystalline phase.

FIG. 1B is a circuit diagram illustrating the conventional phase change memory device. As illustrated in the drawing, the phase change memory device includes a variable resistor C connected to a bit line BL and a word line WL connected between the variable resistor C and a ground voltage. The variable resistor C includes a lower electrode, a phase change layer, and an upper electrode.

It is necessary for such a phase change memory device to be primarily manufactured in a low cost, and have a unit cell of high integration or high density for realizing a high capacity.

In order to raise the integration or density of the unit cell, it is necessary to concentrate the current to a portion where the phase change layer and the lower electrode are in contact with each other to raise the current density. However, because a high current is required for the phase change of the phase change layer, a channel width of a transistor is necessarily increased, and thus a size of the unit cell should also be increased.

In addition, in the conventional phase change memory device, when forming a ground line using a damascene process, an etching damage to a lower portion layer is generated in a ground line area formed elongated like a bar when an etching process, which results in characteristic degradation of the finally obtained phase change memory device.

BRIEF SUMMARY OF THE INVENTION

Embodiments of the present invention are directed to a phase change memory device capable of reducing a size of a unit cell as well as raising current flow in a transistor, and a method for manufacturing the same.

Embodiments of the present invention are further directed to a phase change memory device capable of preventing generation of an etching damage to a lower portion layer, and a method for manufacturing the same.

In one aspect of the present invention, there is provided a phase change memory device including: a semiconductor substrate having active areas; a pair of word lines formed over the active areas and connected with each other at each end thereof; source areas formed in the respective active areas at both sides of the pair of word lines; drain areas formed in the respective active areas between the word lines of the pair of word lines connected with each other at each end thereof; ground lines and cell selection lines formed so as to make contact with the respective source areas respectively; lower electrodes formed so as to make contact with the drain areas; phase change layers and upper electrodes stacked over the respective lower electrodes; and bit lines formed over upper portion of the active areas so as to make contact to the upper electrodes.

The phase change memory device may further include first contact plugs interposed between the source area and the ground line, the source area and the cell selection line and the drain area and the lower electrode.

The phase change memory device may further include second contact plug interposed between the lower electrode and the phase change layer.

The phase change memory device may further include third contact plug interposed between the upper electrode and the bit line.

In another aspect of the present invention, there is provided a phase change memory device including: a semiconductor substrate having a plurality of bar-type active areas arranged at equal distances; first pairs of word lines and second pairs of word lines, formed on the semiconductor substrate such that they are arranged alternately with each other in a direction perpendicular to the active areas and in which the first pair of word lines connected to each other at each first end thereof and the second pair of word lines connected to each other at each second end thereof opposite to the first end; source areas formed in the respective active areas between the first pairs of word lines and the second pairs of word lines; drain area formed in the respective active areas between the word lines of the first pairs of word lines and the word lines of the second pairs of word lines; ground lines and cell selection lines formed alternately every between the first pairs of word lines and the second pairs of word lines so as to make contact with the respective source area; dot-type lower electrodes formed so as to make contact with the respective drain areas; phase change layers and upper electrodes stacked over the respective lower electrodes; and a plurality of bit lines arranged over the respective active areas and formed so as to make contact with the respective upper electrode formed in the corresponding active areas.

The phase change memory device may further include first contact plugs interposed between the source area and the ground line, the source area and the cell selection line and the drain area and the lower electrode.

The phase change memory device may further include second contact plug interposed between the lower electrode and the phase change layer.

The phase change memory device may further include third contact plug interposed between the upper electrode and the bit line.

In yet another aspect of the present invention, there is provided a method for manufacturing a phase change memory device, the method including the steps of: forming first pairs of word lines connected to each other at each first end thereof and second pairs of word lines connected to each other at each second end thereof opposite to the first end over a substrate having a plurality of bar-type active areas arranged at equal distances so that they are arranged alternately in a direction perpendicular to the active areas; forming source areas in the respective active areas between the first pairs of word lines and the second pairs of word lines; forming drain areas in the respective active areas between the word lines of the first pairs of word lines and the word lines of the second pairs of word lines; forming ground lines and cell selection lines arranged alternately every between the first pairs of word lines and the second pairs of word lines so as to make contact with the respective source area and a plurality of dot-type lower electrodes formed so as to make contact with the respective drain areas; stacking phase change layers and upper electrodes over the respective lower electrodes; and forming bit lines arranged over the respective active areas and formed so as to make contact with the respective upper electrodes.

The ground lines, the cell selection lines and the lower electrodes may be formed such that the lower electrodes are formed first and then the ground lines and the cell selection lines are formed later.

The ground lines, the cell selection lines and the lower electrodes may also be formed such that the ground lines and the cell selection lines are formed first and then the lower electrodes are formed later.

The lower electrodes are formed using a damascene process.

This method of manufacturing a phase change memory device may further include the step of, after the step of forming the drain areas and before the step of forming the ground lines, the cell selection lines and the lower electrodes, forming first contact plugs formed over the respective source areas and the respective drain areas and to make contact with the ground lines, the cell selection lines and the lower electrodes.

This method of manufacturing a phase change memory device may further include the step of, after the step of forming the lower electrodes and before the step of forming the phase change layers and the upper electrodes, forming second contact plugs formed over the lower electrodes to make contact with the phase change layers.

This method of manufacturing a phase change memory device may further include the step of, after the step of forming the phase change layers and the upper electrodes and before the step of forming the bit lines, forming third contact plugs formed over the upper electrodes to make contact with the bit lines.

DESCRIPTION OF SPECIFIC EMBODIMENTS

In an embodiment of the present invention, a plurality of elongated active areas are arranged in a direction of a NOR flash type bit line and are spaced at a equal distance from each other along the word line direction. The word line are paired such that the two word lines in each pair are connected to each other at the predetermined ends to form a single logical word line pair. A drain end, which is to be formed with a phase change layer, is formed between the word lines of two adjacent word line pairs.

The phase change memory device in accordance with an embodiment of the present invention is capable of improving the current flow more efficiently and effectively than widening a conventional channel width by two times to increase the current flow. By employing two word lines to form a single logical word line pair, there are two paths of current flow from the drain end to a ground voltage end, i.e. a source end, according to an embodiment of the present invention. Further, the phase change memory device in accordance with an embodiment of the present invention is capable of improving the current flow to be more stable since the difference in the distance between the adjacent cells, that is, the distance from the phase change layer in the drain end to the source end, is not large.

Furthermore, according to an embodiment of the present invention, a ground line formed by a damascene process is arranged in a direction perpendicular to the direction of the active areas, and thus the length thereof is made shorter. In this case, the generation of an etching damage to a lower portion layer can be prevented by decreasing the length of a layer formed by the damascene process.

Reference will now be made in detail to a phase change memory device according to preferred embodiment of the present invention and a method for manufacturing the same with reference to the accompanying drawings.

Figure 1A:
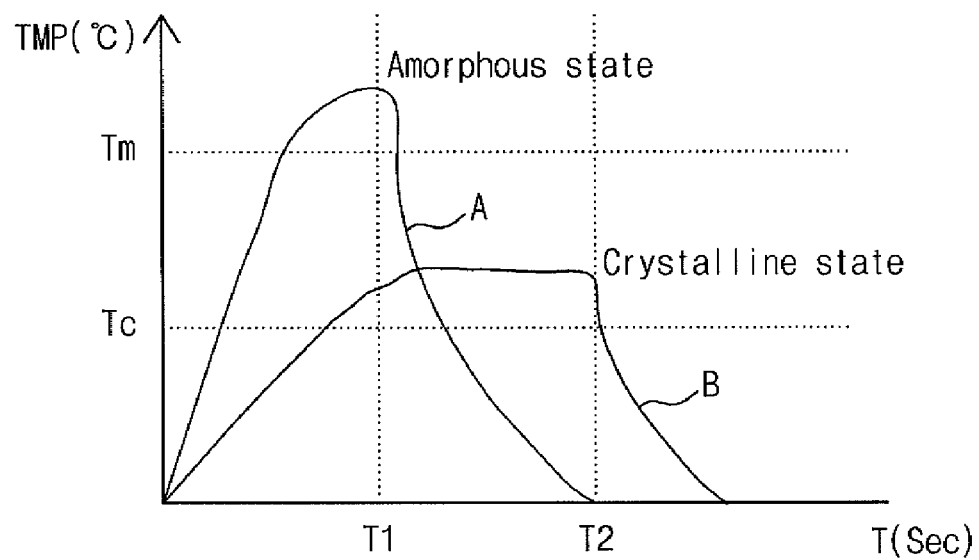
FIG. 1A is a graph illustrating a phase change in a conventional phase change memory device.
Figure 1B:
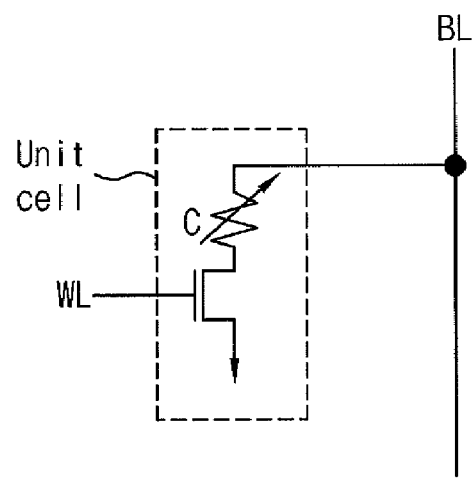
FIG. 1B is a circuit diagram illustrating a conventional phase change memory device.
Figure 2:
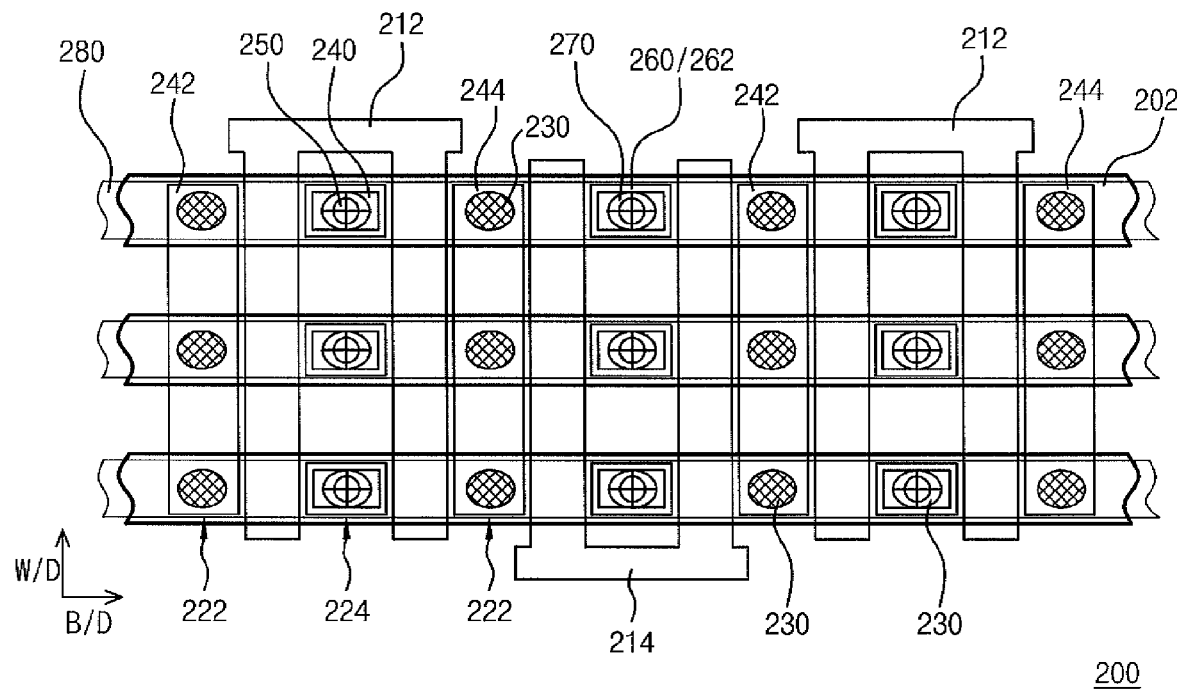
FIG. 2 is a plan view illustrating a phase change memory device in accordance with a preferred embodiment of the present invention.

FIG. 2 is a plan view illustrating a phase change memory device according to a preferred embodiment of the present invention.

As shown in FIG. 2, a semiconductor substrate 200 is provided with a plurality of linearly elongated bar-type active areas 202. The bar-type active areas 202 are arranged parallely to extend in a bit line direction (B/D), and these pararelly arranged bar-type active areas 202 are spaced at a equal distance in the word line direction (W/D) from each other. A plurality of word lines 212 and 214 are formed over the semiconductor substrate 200 so as to be arranged in a bit line direction (B/D) perpendicular to the active areas 202. Each word line pair 212 or 214 is formed of two word lines that are connected to each other at their ends. For example, a plurality of first word line pairs 212 are arranged such that the two word lines of each first pair 212 is connected to each other at their first ends as shown in FIG. 2, and a plurality of second word line pairs 214 are arranged such that the two word lines of each second pair 214 are connected to each other at their second ends, where the second ends are located at the opposite side of the first ends as shown in FIG. 2 (for example, the top end and the bottom end, respectively). The word lines of the first and second word lines pairs 212 and 214 are arranged in the word line W/D direction in an alternating manner as shown in FIG. 2.

A plurality of source areas 222 are formed in the portions of the active areas 202 along the B/D direction, where each source area is formed at the portions of the active layer 202 along the B/D direction between one word line of the first pair 212 and the adjacent one word line of the alternately arranged second pair 214 as shown in FIG. 2. Drain areas 224 are formed in the portions of the active areas 202 along the B/D direction between the two word lines of each first pair 212 or each second pair 214 as this is also shown in FIG. 2. First contact plug 230 is formed over each source area 222 and over each drain area 224.

A dot-type lower electrode 240 is formed to make contact with the respective drain area 224 through the first contact plug 230. Ground lines 242 and cell selection lines 244 are formed so that each one of them is arranged in the area along the W/D direction between two word line pairs 212 and 214 in an alternating manner as shown in FIG. 2. Each ground line 242 and each cell selection line 244 are connected to the corresponding source areas 222 through the first contact plugs 230. Further, a plurality of second contact plugs 250 are formed between two word lines of each first pair 212 and between the two word line of each second pair 214 such that each second contact plug 250 is formed over the respective lower electrode 240. A phase change layer 260 and an upper electrode 262 are stacked over each second contact plug 250, thereby constructing a phase change cell consisting of the lower electrode 240, the phase change layer 260, and the upper electrode 262 as well as two transistors (not shown in FIG. 2).

A third contact plug 270 is formed on each one of the upper electrodes 262. A plurality of bit lines 280 are formed along the B/D direction over the plurality of the active areas 202 in an overlapping manner. Each bit line 280 is connected with a plurality of upper electrodes 262 in the active area 202 corresponding to the bit line 280 through the third contact plugs 270.

Each third contact plug 270 is formed so as to have a size larger than the second contact plug 250 but smaller than the upper electrode 262 and overlapps the respective upper electrode 262.

According to an embodiment of the present invention as described above, two paths of current flow are formed by a pair of word lines that allows the current to flow from the bit line through the phase change layer and the drain area to the source area such that the amount of current flow is increased more effectively than widening a channel width by two times. Further, since the difference in the distance measured from the phase change layer to the source area is not large, it is possible not only to reduce the size of a unit cell but also to allow high current flow in a stable manner. Further, since the length of a ground line can be shortened, it is possible to restrict or minimize the etching loss in a lower portion layer when forming the ground line using a damascene process.

Figure 3:
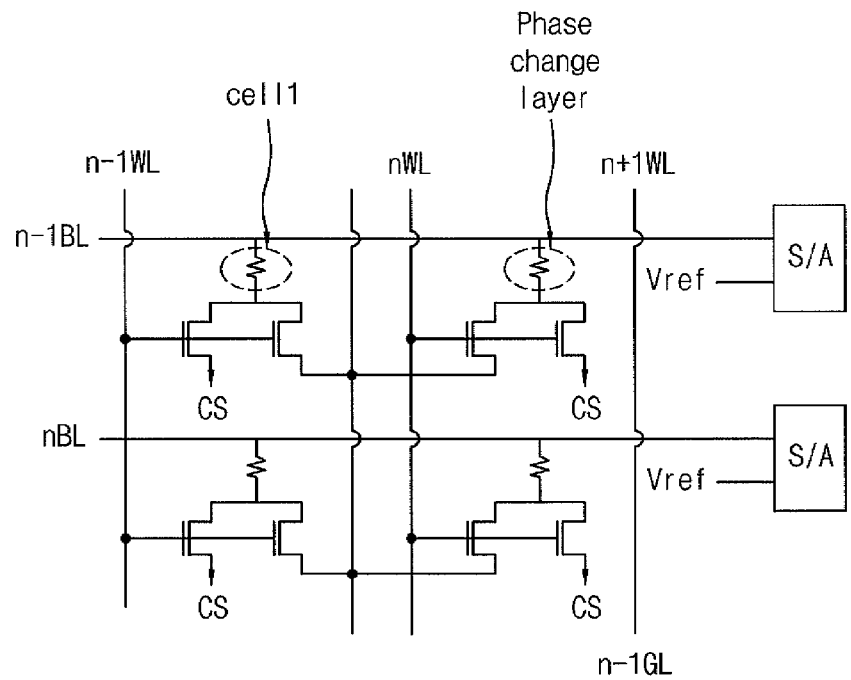
FIG. 3 is a circuit diagram illustrating the phase change memory device in accordance with a preferred embodiment of the present invention.

FIG. 3 is a circuit diagram illustrating the phase change memory device in accordance with a preferred embodiment of the present invention and reading and writing operations will be described with reference to FIG. 3.

In a case of write operation, when the nth word line (nWL) is activated, and (n−1)th bit line (n−1BL) is maintained at a predetermined voltage level, and (n−1)th ground line (n−1GL) is applied with Vss (for example, the ground), and a cell selection line (CS) is also applied with Vss, then the current flows from the (n−1)th bit line (n−1BL) to the (n−1)th ground line (n−1GL) and to the cell selection line (CS) such that a write operation is performed to the "cell 1" (where $n \geq 1$) as shown in FIG. 3.

Herein, the phase change layer changed to an amorphous phase as the bit line is applied with a higher voltage to have a higher resistance is considered to symbolize the data "1" for the purposes of describing the embodiments of the present invention, while the phase change layer changed to a crystalline phase as the bit line is applied with a lower voltage to have a lower resistance is considered to symbolize data "0".

In a case of read operation, the nth word line (nWL) is activated to flow current from the (n−1)th bit line (n−1BL), which is maintained at a predetermined voltage level, to the (n−1)th ground line (n−1GL) and the cell selection line (CS). Then, a lower current flows due to the phase change layer of high resistance producing a small voltage drop in the case of data "1", while a larger voltage drop is produced due to the phase change layer of low resistance in the case of data "0".

Meanwhile, the (n−1)th ground line (n−1GL) serves so that the (n−1)th word line (n−1WL) and the n word line (nWL) are all applied with Vss, but the cell selection line (CS) is activated only when the word line thereof is activated.

FIGS. 4A to 4G are cross-sectional views for explaining a method for manufacturing a phase change memory device according to a preferred embodiment of the present invention.

Figure 4A:
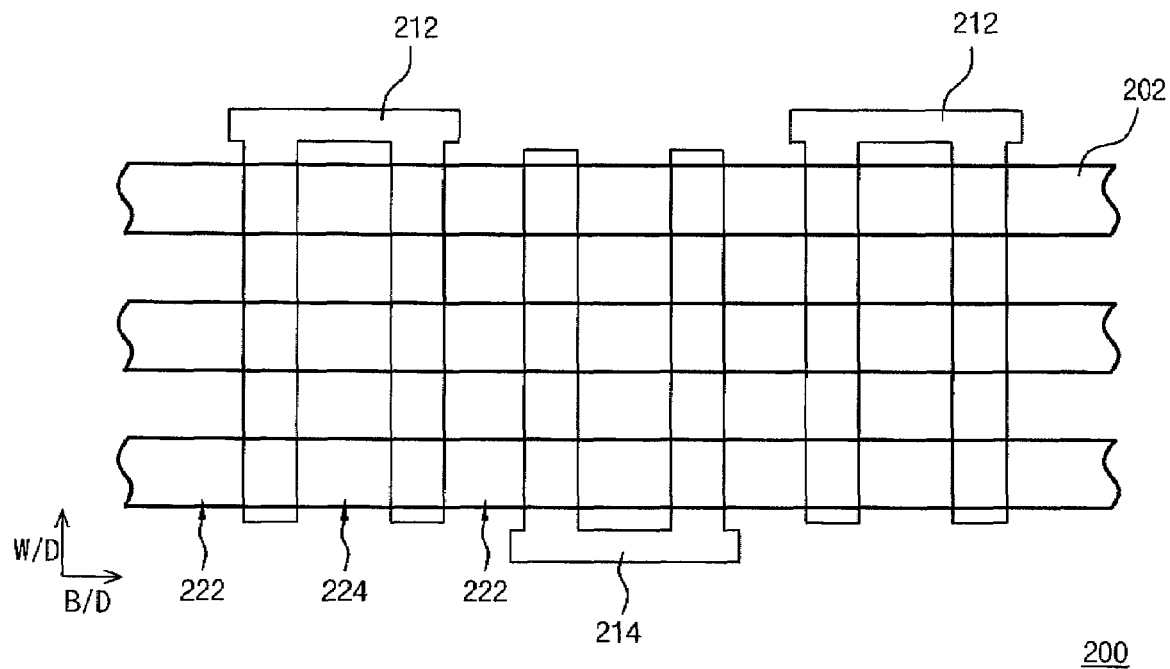
FIGS. 4A to 4G are cross-sectional views for explaining a method for manufacturing a phase change memory device in accordance with a preferred embodiment of the present invention.

Referring to FIG. 4A, a plurality of first and second pairs of word lines 212 and 214 (each of which word line pair 212 or 214 is connected at the predetermined ends of the word lines) are formed along the word line direction (W/D) over a semiconductor substrate 200 having a plurality of bar-type active areas 202 that are formed on the substrate 200 along the bit line direction (B/D) such that the plurality of elongated active areas 202 are arranged at an equal distance from each other. The word lines arranged in the W/D direction and the active areas in the B/D direction are arranged perpendicular to each other. Each first word line pair 212 includes a pair of word lines 212 connected to each other at the first ends of the word lines, and each second word line pair 214 also includes a pair word lines 214 that are connected to each other at the second ends of the word lines such that the first and second ends are located at the opposite ends of the respective word lines as shown in FIG. 4A. The first word line pairs 212 and the second word line pairs 214 are arranged over the substrate 200 in an alternating manner as shown in FIG. 4A. A plurality of source area 222 are formed in the portions of the active areas 202 along the W/D direction between one word line of the first word line pair 212 and adjacent word line of the second word line pair 214, where the word line pairs 212 and 214 are alternately arranged over the substrate 200. A plurality of drain areas 224 are formed in the portions of the active areas 202 along the W/D direction between the two word lines of each first word line pair 212 and between the two word lines of each second word line pair 214.

Figure 4B:
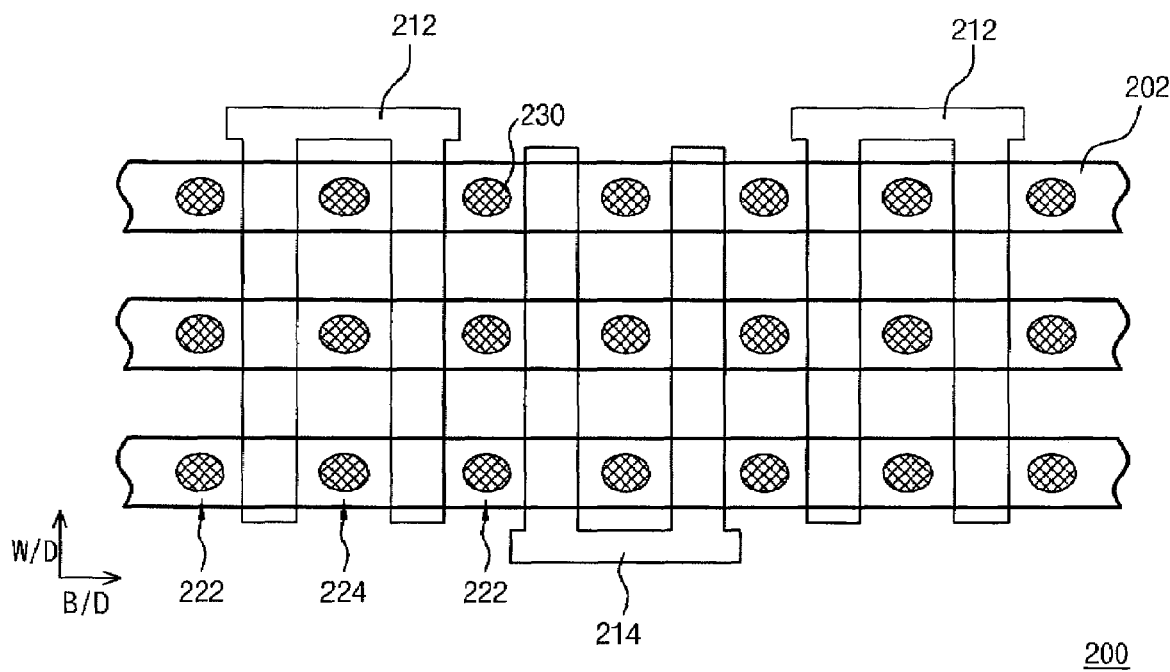

Referring to FIG. 4B, a first insulating layer (not labeled at it is overlapping) is formed over the semiconductor substrate 200 formed with the first and second word line pairs 212, 214 and the source and drain areas 222, 224. The first insulating layer (not labeled) is etched to form the first contact holes through which the source and drain areas 222 and 224 respectively are exposed. The first contact holes are then filled with an electrically conductive layer, thereby forming first contact plugs 230 that make contacts with the source and drain areas 222 and 224.

Figure 4C:
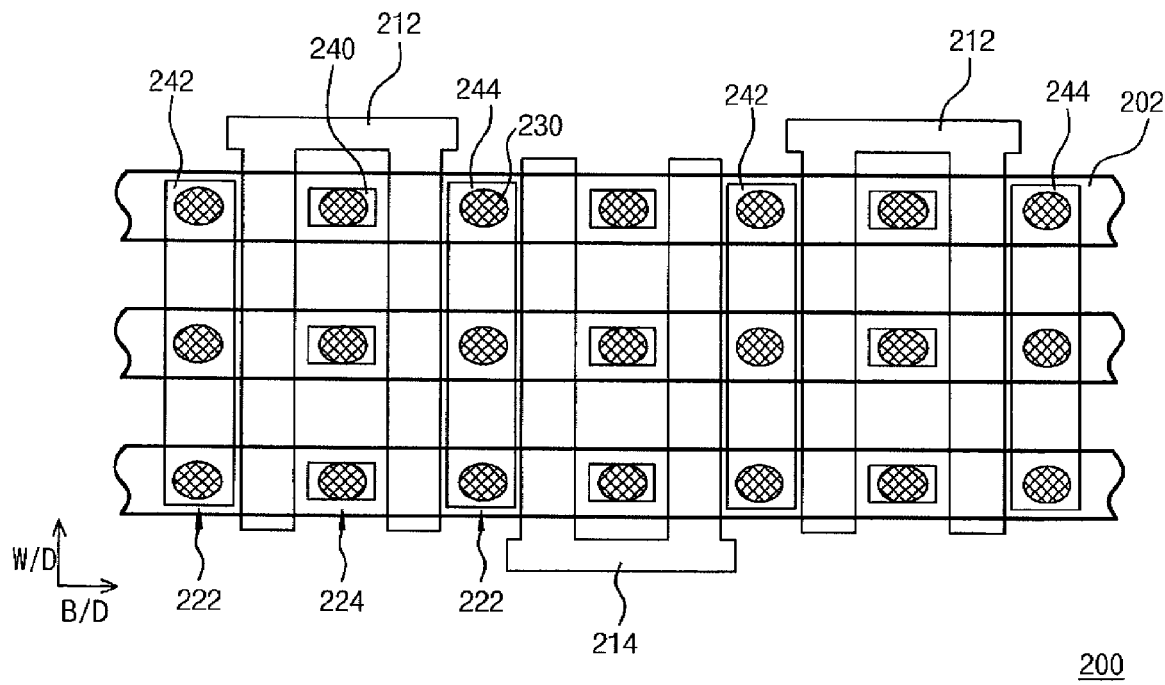

Referring to FIG. 4C, a second insulating layer (not labeled as it is overlapping) is formed over the first insulating layer including the first contact plugs 230. Dot-type lower electrodes 240 are formed such that each of which electrode 240 makes contact with the corresponding drain area 224 through the first contact plugs 230 using a well-known damascene process. Likewise, according to the well-known damascene process, the etching of the second insulating layer, the deposition of a metal layer, and the etching of the metal layer are sequentially performed to form ground lines 242 and cell selection lines 244, which are arranged alternately in every area between the first word line pair 212 and the second word line pair 214 and connected to the corresponding source areas 222 through the first contact plugs 230.

It is noted that rather lengthy ground lines are formed using a damascene process in a device of the conventional art, which contributes to generation of etching damages in the lower portion layer during a formation procedure. However, according to an embodiment of the present invention, since shorter ground lines 242 are formed in the direction perpendicular to the active areas 202, it is possible to restrict or minimize the generation of the etching damages in the lower portion layer during the formation procedure. Further, in the conventional art, the dot-type lower electrodes and the ground lines are formed simultaneously using the damascene process; however, according to an embodiment of the present invention, since the lower electrodes 240 are formed before the ground lines 242 including the cell selection lines 244 are formed, it is possible to reduce the etching damages even more from being generated in the lower portion layer during the procedure of forming the ground lines 242.

In a preferred embodiment of the present invention, the dot-type lower electrodes 240 are formed before the ground lines 242 and the cell selection lines 244 are formed; however, it should also be recognized that the ground lines 242 and the cell selection lines 244 could be formed before the dot-type lower electrodes 240 are formed as another embodiment of the present invention.

Figure 4D:
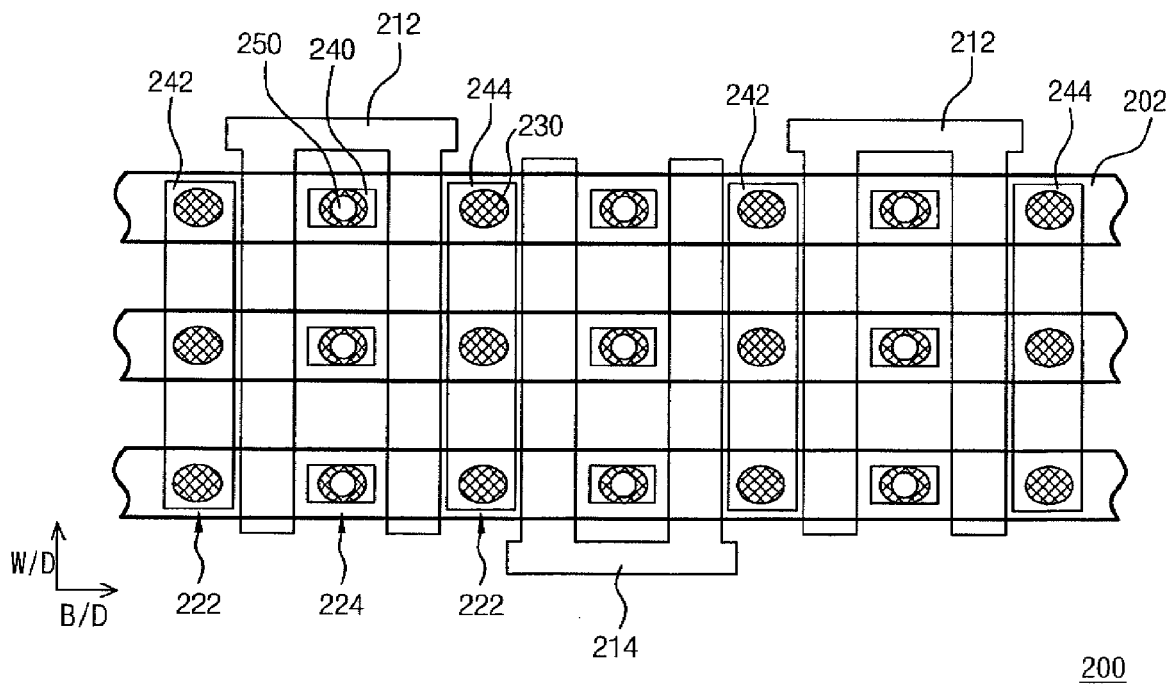

Referring to FIG. 4D, a third insulating layer (not labeled as it is an overlapping layer) is formed over the second insulating layer including the lower electrodes 240, the ground lines 242, and the cell selection lines 244. The third insulating layer is etched to form a plurality of second contact holes through which the respective lower electrodes 240 are exposed. The second contact holes are then filled with an electrically conductive layer, thereby forming second contact plugs 250, which make contact with the respective lower electrodes 240.

Figure 4E:
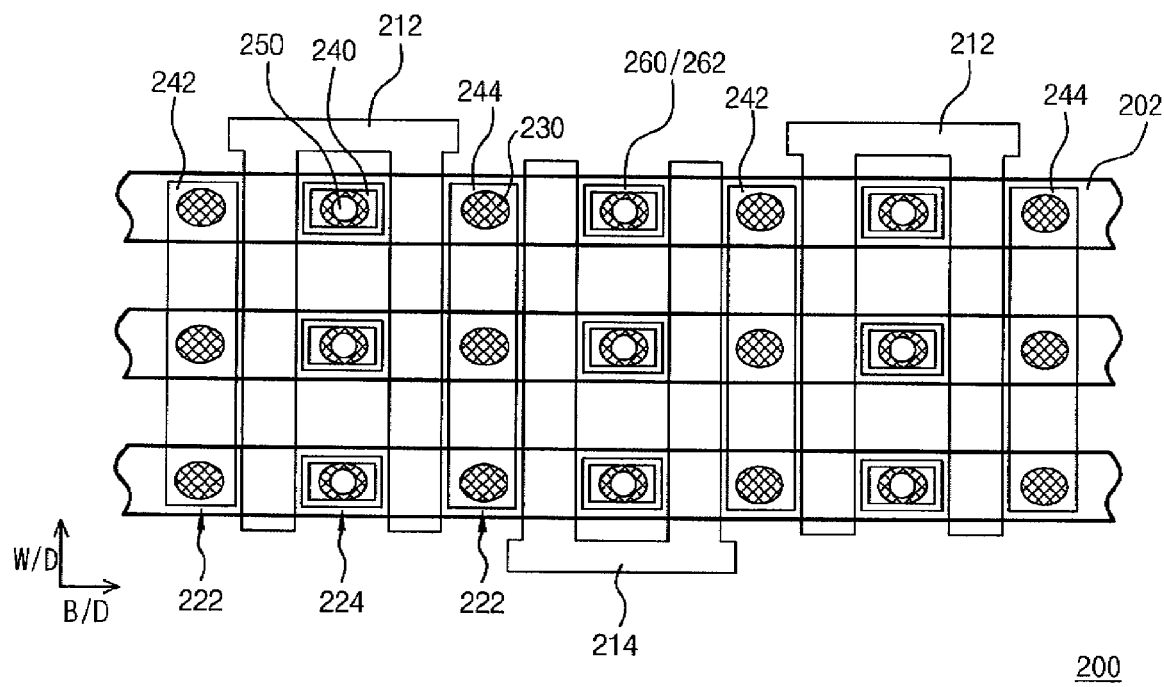

Referring to FIG. 4E, a phase change material layer and an electrically conductive layer for upper electrodes (both layers not labeled as they are overlapping layers) are formed in sequence on the third insulating layer including the second contact plugs 250, and then the phase change material layer and the electrically conductive layer for upper electrodes are etched to form the stack patterns, each of which consists of an upper electrode 262 and a phase change layer 260 which makes contact with the lower electrode 240 through the second contact plug 250.

Figure 4F:
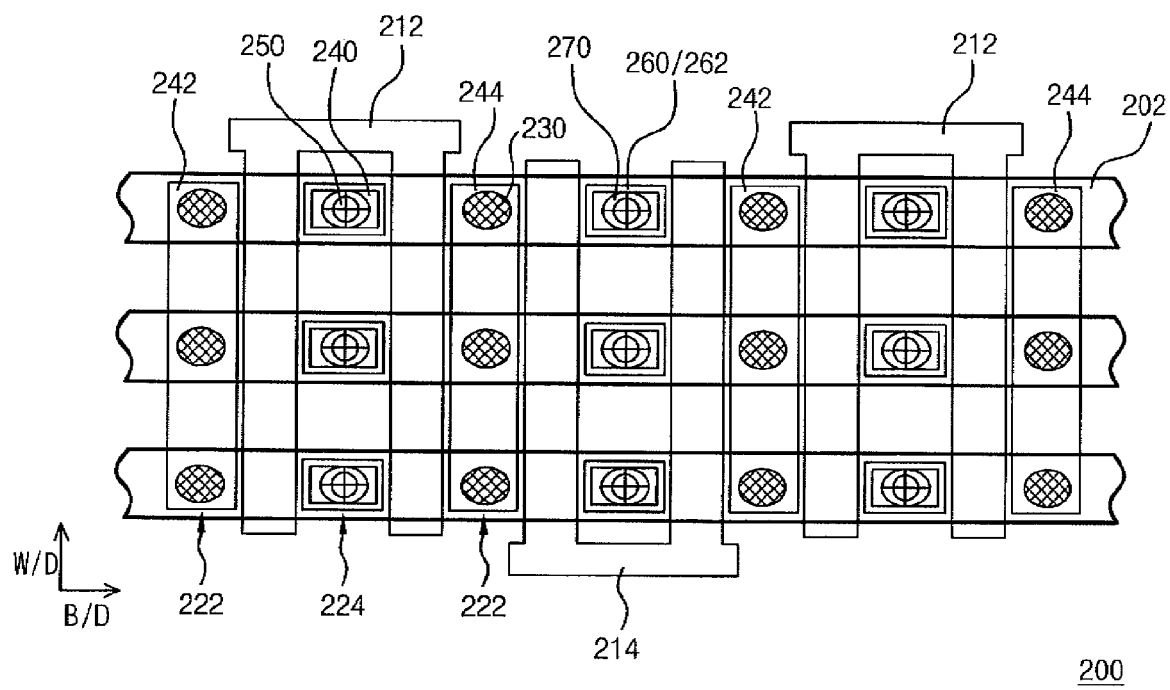

Referring to FIG. 4F, a fourth insulating layer (not labeled as it is an overlapping layer) is formed over the third insulating layer so as to cover the stack patterns of the phase change layer 260 and the upper electrode 262. The fourth insulating layer is then etched to form a plurality of third contact holes through which the upper electrodes 262 are exposed, and then the third contact holes are filled with an electrically conductive layer, thereby forming third contact plugs 270. The third contact plug 270 is formed so as to have a size larger than the second contact plug 250 and smaller than the upper electrode 262 and is formed so as to be overlapped with the upper electrode 262.

Figure 4G:
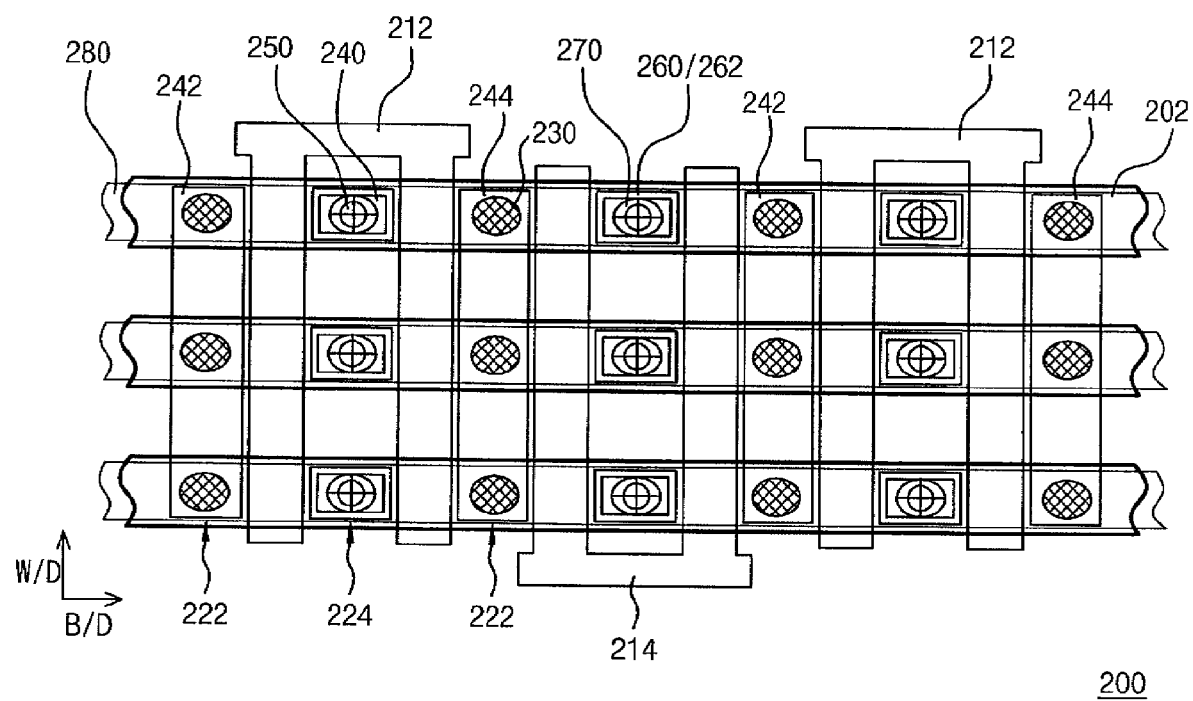

Referring to FIG. 4G, an electrically conductive layer such as a metal layer etc. is formed over the fourth insulating layer including the third contact plugs 234, and then the electrically conductive layer is etched to form a plurality of bit lines 280 which are arranged in the direction of the active areas 202 and make contact with the corresponding upper electrode contact plugs 234 over the upper portion of the active areas 202.

After that, a series of well-known follow-up processes are performed to complete a manufacture of the phase change memory device according to a preferred embodiment of the present invention.

As described above, according to the present invention and the manufacturing method thereof, it is capable of reducing the size of a unit cell as well as improving the current flow by forming two current flows from the drain end to the source end. Also, according to the present invention and the manufacturing method thereof, by making the length of the ground lines formed by a damascene process shorter than that of the conventional art, it is possible to prevent the generation of the etching damage to the lower portion layer and thus improve reliability of a device.

Although preferred embodiments of the present invention have been described for illustrative purposes, the present invention is not limited thereto, and those skilled in the art will appreciate that various modifications, additions and substitutions are possible, without departing from the scope and spirit of the invention as disclosed in the accompanying claims.

What is claimed is:

1. A phase change memory device, comprising:
   a semiconductor substrate having active areas;
   a pair of word lines formed over portions of the active areas and connected with each other at the ends of the word lines;
   source areas formed in the portions of the active areas adjacent but not in between the two word lines of the pair;
   drain areas formed in the portions of the active areas between the two word lines of the pair;
   ground lines and cell selection lines formed so as to make contact with the respective source areas;
   lower electrodes formed so as to make contact with the drain areas;
   phase change layers and upper electrodes stacked over the respective lower electrodes; and
   bit lines formed over upper portion of the active areas so as to make contact to the upper electrodes.

2. The phase change memory device of claim 1, further comprising a first contact plug interposed between the source area and the ground line or between the source area and the cell selection line or between the drain area and the lower electrode.

3. The phase change memory device of claim 1, further comprising a second contact plug interposed between the lower electrode and the phase change layer.

4. The phase change memory device of claim 1, further comprising a third contact plug interposed between the upper electrode and the bit line.

5. A phase change memory device, comprising:
   a semiconductor substrate having a plurality of linearly elongated active areas arranged at an equal distance from each other;
   a plurality of first word line pairs and a plurality of second word line pairs formed on the semiconductor substrate, wherein the first and second word line pairs are arranged in an alternating and non-repeating pattern, wherein each of the first and second word line pairs comprises two word lines formed in a direction perpendicular to the active areas, each word line having two ends of a first end and a second end,
   wherein the two word lines of the first word line pair are connected to each other at the first ends of the word lines, and
   wherein the two word lines of the second word line pair are connected to each other at the second ends of the word lines;
   a plurality of source areas formed in the portions of the active areas between one word line of the first word line pair and one word line of the second word line pair for every two adjacent first and second word line pairs;
   a plurality of drain area formed in the portions of the active areas between the two connected word lines of every first word line pair and in the portions of the active areas between the two connected word lines of every second word line pair;
   a plurality of ground lines and a plurality of cell selection lines, each ground line or each cell selection line being formed between one word line of the first word line pair and one word line of the second word line pair for every two adjacent first and second word line pairs to make contact with the respective source areas, wherein the ground lines and cell selection lines are arranged in an alternating and non-repeating pattern;
   a plurality of dot-type lower electrodes formed so as to make contact with the respective drain areas;
   a plurality of phase change layers and a plurality of upper electrodes stacked over the respective lower electrodes; and
   a plurality of bit lines arranged over the respective active areas and formed so as to make contact with the respective upper electrode formed in the corresponding active areas.

6. The phase change memory device of claim 5, further comprising a plurality of first contact plugs interposed between the source area and the ground line or between the source area and the cell selection line or between the drain area and the lower electrode.

7. The phase change memory device of claim 5, further comprising a plurality of second contact plugs interposed between the lower electrode and the phase change layer.

8. The phase change memory device of claim 5, further comprising a plurality of third contact plugs interposed between the upper electrode and the bit line.

9. A method for manufacturing a phase change memory device, comprising the steps of:
   forming a plurality of first word line pairs and a second word line pairs over a semiconductor substrate having a plurality of linearly elongated active areas that are spaced substantially equal distance from each other and are parallelly arranged along a predetermined direction,
   wherein each of the first and second word line pairs has two word lines, each word line having two opposite ends of a first end and a second end,
   wherein the two word lines of each first word line pair are connected to each other at their first ends,
   wherein the two word lines of each second word line pair are connected to each other at their second ends, and
   wherein the word lines of the first and second word line pairs are arranged in the direction substantially perpendicular to the direction of the active areas, and
   wherein the first and second word line pairs are arranged in a alternating and non-repeating pattern;
   forming a plurality of source areas in the portions of the active areas between one word line of the first word line pair and one word line of the second word line pair for every two adjacent first and second word line pairs;
   forming a plurality of drain areas in the portions of the active areas between the two connected word lines of every first word line pair and in the portions of the active areas between the two connected word lines of every second word line pair;
   forming a plurality of ground lines and a plurality of cell selection lines, each ground line or each cell selection line being arranged between one word line of the first word line pair and one word line of the second word line pair for every two adjacent first and second word line pairs to make contact with the respective source areas, wherein the ground lines and cell selection lines are arranged in an alternating and non-repeating pattern;
   forming a plurality of dot-type lower electrodes so as to make contact with the respective drain areas;
   stacking a plurality of phase change layers and a plurality of upper electrodes over the respective lower electrodes; and
   forming a plurality of bit lines arranged over the respective active areas and so as to make contact with the respective upper electrodes.

10. The method for manufacturing a phase change memory device of claim 9, wherein the ground lines, the cell selection lines, and the lower electrodes are formed such that the lower electrodes are formed before the ground lines and the cell selection lines are formed.

11. The method for manufacturing a phase change memory device of claim 9, wherein the ground lines, the cell selection lines, and the lower electrodes are formed such that the ground lines and the cell selection lines are formed before the lower electrodes are formed.

12. The method for manufacturing a phase change memory device of claim 9, wherein the lower electrodes are formed using a damascene process.

13. The method for manufacturing a phase change memory device of claim 9, further comprising the step of:

after the step of forming the drain areas and before the step of forming the ground lines and the cell selection lines and the lower electrodes, forming a plurality of first contact plugs formed over the respective source areas and the respective drain areas to make contact with the ground lines or the cell selection lines or the lower electrodes.

14. The method for manufacturing a phase change memory device of claim 9, further comprising the step of:

after the step of forming the lower electrodes and before the step of forming the phase change layers and the upper electrodes, forming a plurality of second contact plugs over the lower electrodes to make contacts with the phase change layers.

15. The method for manufacturing a phase change memory device of claim 9, further comprising the step of:

after the step of forming the phase change layers and the upper electrodes and before the step of forming the bit lines, forming a plurality of third contact plugs over the upper electrodes to make contact with the bit lines.

* * * * *